United States Patent
Lee et al.

(10) Patent No.: US 10,908,201 B2
(45) Date of Patent: Feb. 2, 2021

(54) DETECTION DEVICE FOR MEASURING ANTENNA

(71) Applicants: Ting Yuan Lee, Taipei (TW); Miao-Lin Hsu, Zhubei (TW); Tsung-Hsin Liu, Zhubei (TW); Yi-Ting Lin, Zhubei (TW)

(72) Inventors: Ting Yuan Lee, Taipei (TW); Miao-Lin Hsu, Zhubei (TW); Tsung-Hsin Liu, Zhubei (TW); Yi-Ting Lin, Zhubei (TW)

( * ) Notice: Subject to any disclaimer, the term of this patent is extended or adjusted under 35 U.S.C. 154(b) by 68 days.

(21) Appl. No.: 16/184,445

(22) Filed: Nov. 8, 2018

(65) Prior Publication Data

US 2020/0150169 A1 May 14, 2020

(51) Int. Cl.
*G01R 29/08* (2006.01)
*G01R 29/10* (2006.01)
*H01Q 17/00* (2006.01)

(52) U.S. Cl.
CPC ............ *G01R 29/10* (2013.01); *H01Q 17/00* (2013.01)

(58) Field of Classification Search
CPC ...... G01R 29/08; G01R 29/10; G01R 1/0408; G01R 1/0416; G01R 1/18; H01Q 17/00
USPC ............................... 324/750.27, 750.26, 537
See application file for complete search history.

(56) References Cited

U.S. PATENT DOCUMENTS

| | | | | |
|---|---|---|---|---|
| 5,965,056 A | * | 10/1999 | Okuyama | H01Q 17/004 174/388 |
| 2012/0257454 A1 | * | 10/2012 | Moshayedi | G11C 16/30 365/185.18 |
| 2014/0091972 A1 | * | 4/2014 | Hoang | G01R 29/10 343/703 |
| 2014/0300519 A1 | * | 10/2014 | Estebe | H01Q 3/267 343/703 |
| 2016/0069943 A1 | * | 3/2016 | Matsumoto | H01Q 1/243 324/149 |
| 2016/0263823 A1 | * | 9/2016 | Espiau | B29C 64/118 |
| 2017/0222737 A1 | * | 8/2017 | Perndl | H04B 17/103 |
| 2018/0080967 A1 | * | 3/2018 | Lee | G01R 29/10 |

* cited by examiner

*Primary Examiner* — Tung X Nguyen
*Assistant Examiner* — Robert P Alejnikov, Jr.
(74) *Attorney, Agent, or Firm* — Muncy, Geissler, Olds & Lowe, P.C.

(57) ABSTRACT

A detection device for measuring an antenna is disclosed, wherein the detection device is provided with a probe seat made of a reflected wave absorbent material; a front end of the probe seat is provided with an extending front arm for connecting to a probe; and a rear end of the probe seat is provided with a connector, of which one end is for connecting to a detection instrument and the other end is electrically connected to the probe through the front arm, thereby when measuring an antenna, the probe seat can absorb reflected waves from the antenna to measure the quality of the antenna pattern.

7 Claims, 2 Drawing Sheets

DETECTION DEVICE FOR MEASURING ANTENNA

BACKGROUND OF THE INVENTION

Field of the Invention

The present invention relates to a detection device for measuring an antenna. The detection device is capable of reducing the influence of reflected waves and thus effectively determining the quality of the antenna pattern when measuring the antenna.

Description of the Related Art

Since the advent of communication products, they have become very popular, and their growth continues to be promising, and their development prospects are promising. People's demand for communication systems are becoming more and more diversified, and thus the fields of wireless communication, wire communication and optoelectronics have been blossomed. Among them, communication ICs are currently the focus of research and development projects in related fields, and particularly the high-frequency communications are rapidly developed with immense development resources invested in the development and design of related circuits, processes and devices. However, these related development and designs ultimately require high-frequency measurement. Using high-frequency measuring technology, users can verify whether the functions of high-frequency devices, circuit components and systems that are critical to the success or failure in a communication system are normal, so as to find out problems and improve them.

With the miniaturization of products, the measurement for an antenna also needs to be miniaturized such that a probe is needed for the measurement. However, when a high-frequency check signal is transmitted to a probe, interference caused by reflected waves needs to be minimized in order to identify an antenna pattern and to further determine the quality of the antenna pattern.

SUMMARY OF THE INVENTION

However, in regard to the influence affecting the quality of an antenna, the industry lacks a solution for effectively avoiding reflected waves. Therefore, to provide a structure different from the prior art, the Inventor provides the present invention on the basis of years of experience and persistent development and improvement.

It is a primary object of the present invention to provide a detection device for measuring an antenna, wherein the detection device is capable of reducing the influence of reflected waves and thus effectively determining the quality of the antenna pattern when measuring the antenna.

To achieve the above object, a detection device for a measuring antenna provided by the present invention includes a probe seat made of a reflected wave absorbent material. A front end of the probe seat is provided with an extending front arm, onto which a probe is combined. A rear end of the probe set is provided with a connector, of which one end is for connecting to a detection instrument and the other end is electrically connected to the probe through the front arm.

Thus, when measuring an antenna, the probe seat can absorb reflected waves from the antenna to measure the quality of the antenna pattern.

In implementation, the reflected wave absorbent material is wood.

In implementation, the front arm is a copper tube, and is enveloped by a wave absorbent material capable of absorbing reflected waves.

In implementation, the wave absorbent material capable of absorbing reflected waves may be a wave absorbent material having certain rigidity, such as foam sponge, acrylic, a pearl plate or polystyrene.

In implementation, the wave absorbent material capable of absorbing reflected waves may be a coating layer, which is paint or glue.

To further understand the present invention, preferred embodiments are given with the accompanying drawings and denotations in the drawings below to describe substantial contents and expected results of the present invention.

DETAILED DESCRIPTION OF THE INVENTION

Figure 1:
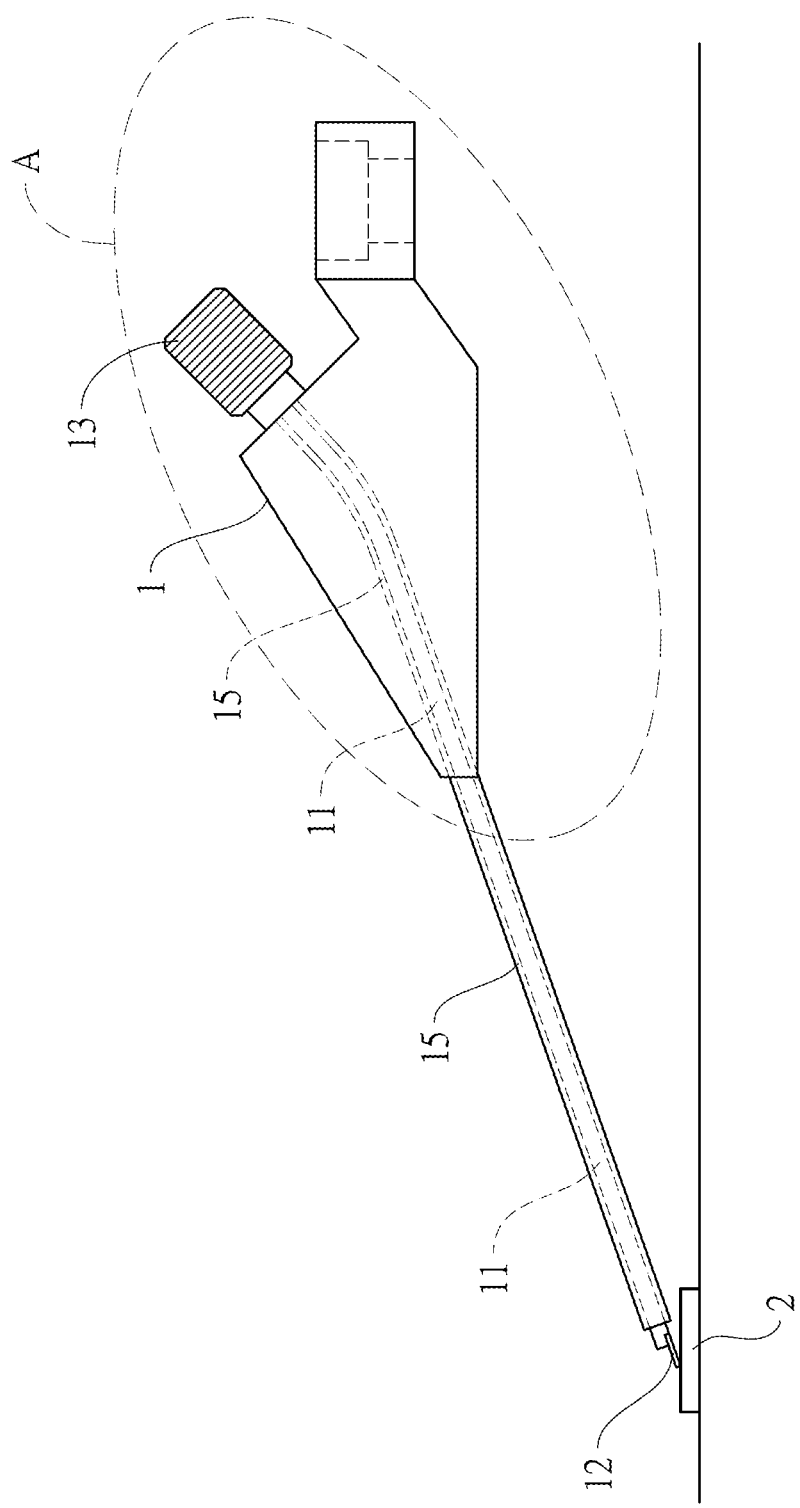
FIG. 1 is a schematic diagram exhibiting a detection device for measuring an antenna according to an embodiment of the present invention.
Figure 2:
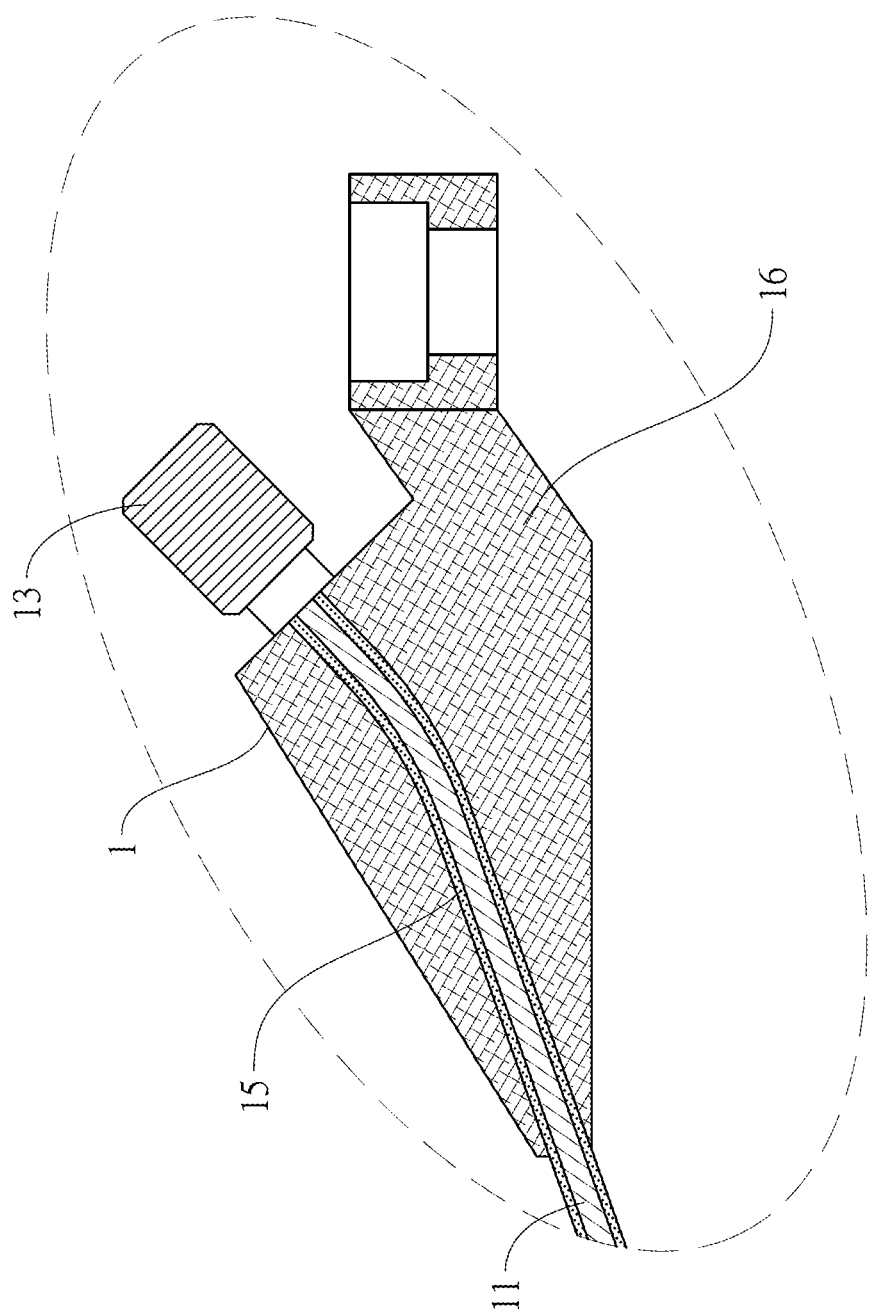
FIG. 2 is a structural schematic diagram of a probe seat according to an embodiment of the present invention.

FIG. 1 and FIG. 2 show a detection device for measuring an antenna according to an embodiment of the present invention.

The detection device for measuring an antenna includes a probe seat 1 made of a reflected wave absorbent material 16. In this embodiment, the reflected wave absorbent material is exemplified by wood. A front end of the probe seat 1 is provided with an extending front arm 11, which is a copper tube for a probe 12 to be combined thereon. A rear end of the probe seat 1 is provided with a connector, of which one end is for connecting to a detection instrument (e.g., a network analyzer) and the other end is electrically connected to the probe 12 through the front arm 11.

Further, the front arm 11 is enveloped by a wave absorbent material 15 capable of absorbing reflected waves. The wave absorbent material 15 capable of absorbing reflected waves may be the wave absorbent material 15 having certain rigidity, such as foam sponge, acrylic, a pearl plate or polystyrene, for enveloping the front arm 11. Alternatively, the wave absorbent material 15 capable of absorbing reflected waves may be a coating layer, such as paint or glue, and may be directly applied on the front arm 11.

Thus, after assembly, when an antenna 2 is measured, the probe seat 1 at the rear end of the probe 12 can absorb reflected waves from a measuring end, allowing the detection instrument (e.g., a network analyzer) to more clearly identify the antenna pattern to further determine the quality of the antenna pattern.

The above disclosure describes the embodiment of the present invention and applied technical means thereof. Various modifications and amendments may be made on the basis of the disclosure or teaching of the present invention, and such modifications and amendments are regarded as equivalent changes of the concept of the present invention without departing the spirit of the description and the drawings of the present invention. Therefore, such modifications and amendments would fall within the technical scope of the present invention.

In conclusion, on the basis of the above disclosure, the detection device for measuring an antenna provided by the present invention achieves an expected result, and provides practicability and industrial applicability. Therefore, an invention application is filed accordingly.

What is claimed is:

1. A detection device for measuring an antenna, the detection device comprising a probe seat, wherein the probe seat is made of a reflected wave absorbent material, the probe seat is provided with a front arm having a first end attached to a probe that is configured to physically contact the antenna and a second end connected to a connector configured to be physically connected to a detection unit, and an end of the connector is connected to the front arm to be electrically connected to the probe via the front arm, such that the probe seat absorbs reflected waves from the antenna when measuring the antenna to further determine a quality of an antenna pattern.

2. The detection device for measuring an antenna according to claim 1, wherein the front arm is enveloped by a wave absorbent material capable of absorbing reflected waves.

3. The detection device for measuring an antenna according to claim 2, wherein the front arm is a copper tube.

4. The detection device for measuring an antenna according to claim 2, wherein the wave absorbent material capable of absorbing reflected waves is a wave absorbing material having certain rigidity.

5. The detection device for measuring an antenna according to claim 4, wherein the wave absorbent material capable of absorbing reflected waves is foam sponge, acrylic, a pearl plate or polystyrene.

6. The detection device for measuring an antenna according to claim 2, wherein the wave absorbent material capable of absorbing reflected waves is a coating layer.

7. The detection device for measuring an antenna according to claim 6, wherein the coating layer is paint or glue.

* * * * *